(12) United States Patent
Li et al.

(10) Patent No.: US 8,584,736 B2
(45) Date of Patent: Nov. 19, 2013

(54) HEAT SINK ASSEMBLY HAVING A FIN ALSO FUNCTIONING AS A SUPPORTING BRACKET

(75) Inventors: Wei Li, Shenzhen (CN); Yi-Qiang Wu, Shenzhen (CN)

(73) Assignees: Fu Zhun Precision Industry (Shen Zhen) Co., Ltd., Shenzhen (CN); Foxconn Technology Co., Ltd., New Taipei (TW)

( * ) Notice: Subject to any disclaimer, the term of this patent is extended or adjusted under 35 U.S.C. 154(b) by 1031 days.

(21) Appl. No.: 12/623,452

(22) Filed: Nov. 23, 2009

(65) Prior Publication Data

US 2011/0120668 A1 May 26, 2011

(51) Int. Cl.
*F28D 15/00* (2006.01)
*H05K 7/20* (2006.01)
*H01L 23/34* (2006.01)
*F28D 15/02* (2006.01)

(52) U.S. Cl.
USPC .. 165/80.3; 165/67; 165/104.26; 165/104.21; 165/104.33; 361/700

(58) Field of Classification Search
USPC ............ 165/80.3, 67, 104.26, 104.21, 104.33
See application file for complete search history.

(56) References Cited

U.S. PATENT DOCUMENTS

| | | | |
|---|---|---|---|
| 6,341,490 B1 * | 1/2002 | Jones | 62/3.7 |
| 7,093,648 B1 * | 8/2006 | Cheng | 165/104.33 |
| 7,215,548 B1 * | 5/2007 | Wu et al. | 361/703 |
| 7,245,495 B2 * | 7/2007 | Ouyang | 361/701 |
| 7,249,626 B2 * | 7/2007 | Hao et al. | 165/104.33 |
| 2004/0050534 A1 * | 3/2004 | Malone et al. | 165/80.3 |
| 2005/0082041 A1 * | 4/2005 | Chen et al. | 165/104.33 |
| 2005/0135065 A1 * | 6/2005 | Nakatsu et al. | 361/703 |
| 2005/0178527 A1 * | 8/2005 | Wang et al. | 165/80.3 |
| 2006/0082972 A1 * | 4/2006 | Kim | 361/709 |
| 2008/0128118 A1 * | 6/2008 | Chen et al. | 165/104.33 |
| 2008/0257527 A1 * | 10/2008 | Li et al. | 165/80.3 |
| 2008/0314556 A1 * | 12/2008 | Zhou et al. | 165/80.3 |

* cited by examiner

*Primary Examiner* — Brandon M Rosati
*Assistant Examiner* — Claire Rojohn, III
(74) *Attorney, Agent, or Firm* — Altis & Wispro Law Group, Inc.

(57) ABSTRACT

An exemplary heat sink assembly includes a base plate, a number of fins, a heat spreader and a heat pipe. The fins are mounted on and thermally connect with the base plate for dissipating heat of the base plate. A bottom one of the fins has a body parallel to the base plate and a number of supporting tabs extending downwardly from the body.
The supporting tabs engage with a top surface of the base plate to support the fins onto the base plate and reinforce a whole strength of the heat sink assembly. The heat spreader is mounted below the base plate. The heat pipe includes a horizontal evaporating portion sandwiched between the heat spreader and the base plate and a vertical condensing portion extending from a free end of the evaporation portion and passing through the fins.

14 Claims, 6 Drawing Sheets

HEAT SINK ASSEMBLY HAVING A FIN ALSO FUNCTIONING AS A SUPPORTING BRACKET

CROSS-REFERENCES TO RELATED APPLICATION

This application is a divisional application of U.S. application Ser. No. 11/737,100, filed on Apr. 18, 2007 and entitled "HEAT SINK ASSEMBLY HAVING A FIN ALSO FUNCTIONING AS A SUPPORTING BRACKET."

BACKGROUND

1. Technical Field

The present invention relates to a heat sink assembly having a number of fins, wherein at least one fin functions as a supporting bracket to reinforce the whole strength of the heat sink assembly.

2. Description of Related Art

Nowadays, numerous kinds of heat sinks are used to dissipate heat generated by electronic devices. A tower type heat sink is a common structure. The tower type heat sink generally includes a base, a number of fins parallel to the base, and a heat pipe thermally connecting the base and the fins. The heat sink has a relatively large height. Thus, the heat sink is prone to becoming deformed when subjected to shock or vibration during transportation or use.

Accordingly, it is desired to provide a heat sink which has a strengthened structure to improve the deformation-resistance thereof.

BRIEF DESCRIPTION OF THE DRAWINGS

Many aspects of the present heat sink assembly can be better understood with reference to the following drawings. The components in the drawings are not necessarily drawn to scale, the emphasis instead being placed upon clearly illustrating the principles of the present heat sink assembly. Moreover, in the drawings, like reference numerals designate corresponding parts throughout the several views.

DETAILED DESCRIPTION

Figure 1:
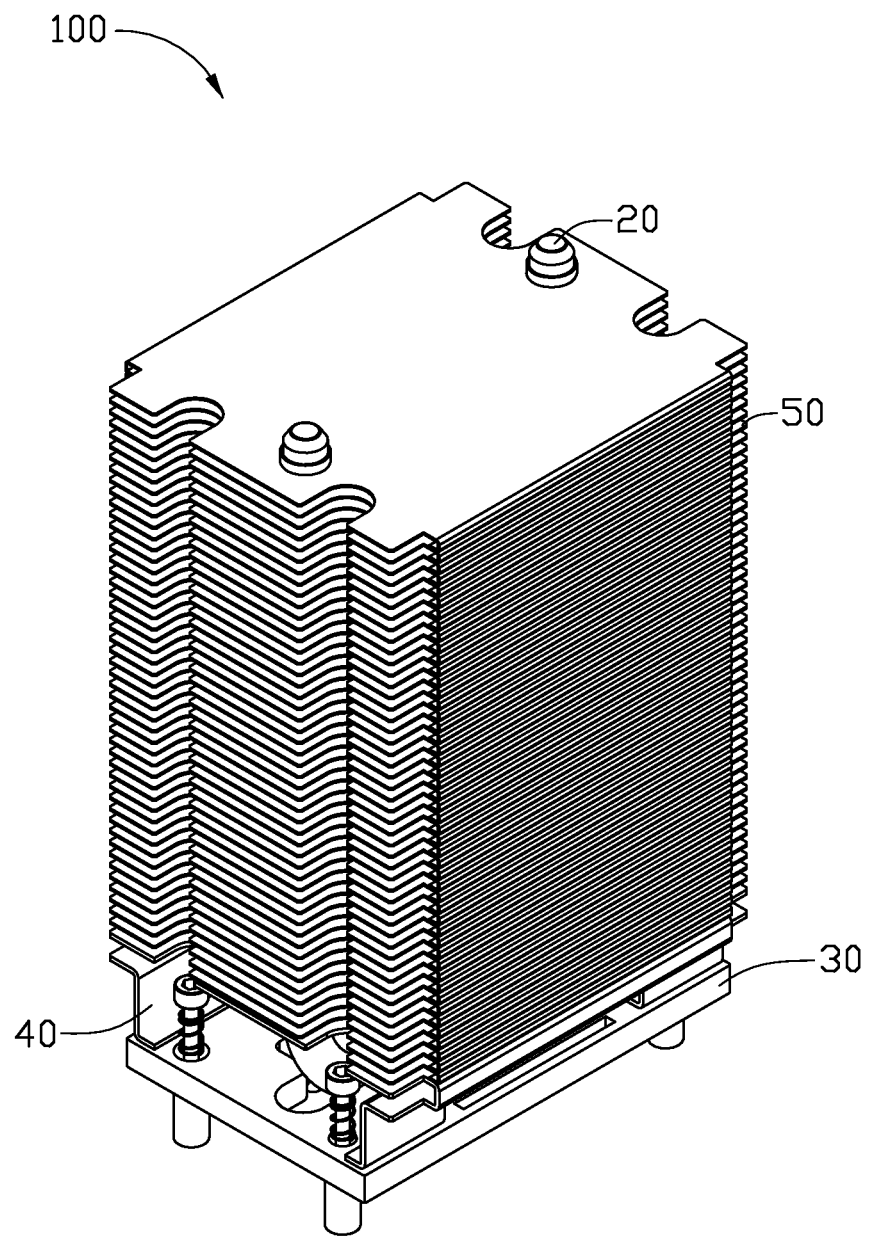
FIG. 1 is an assembled view of a heat sink assembly in accordance with a first embodiment of the present disclosure.
Figure 2:
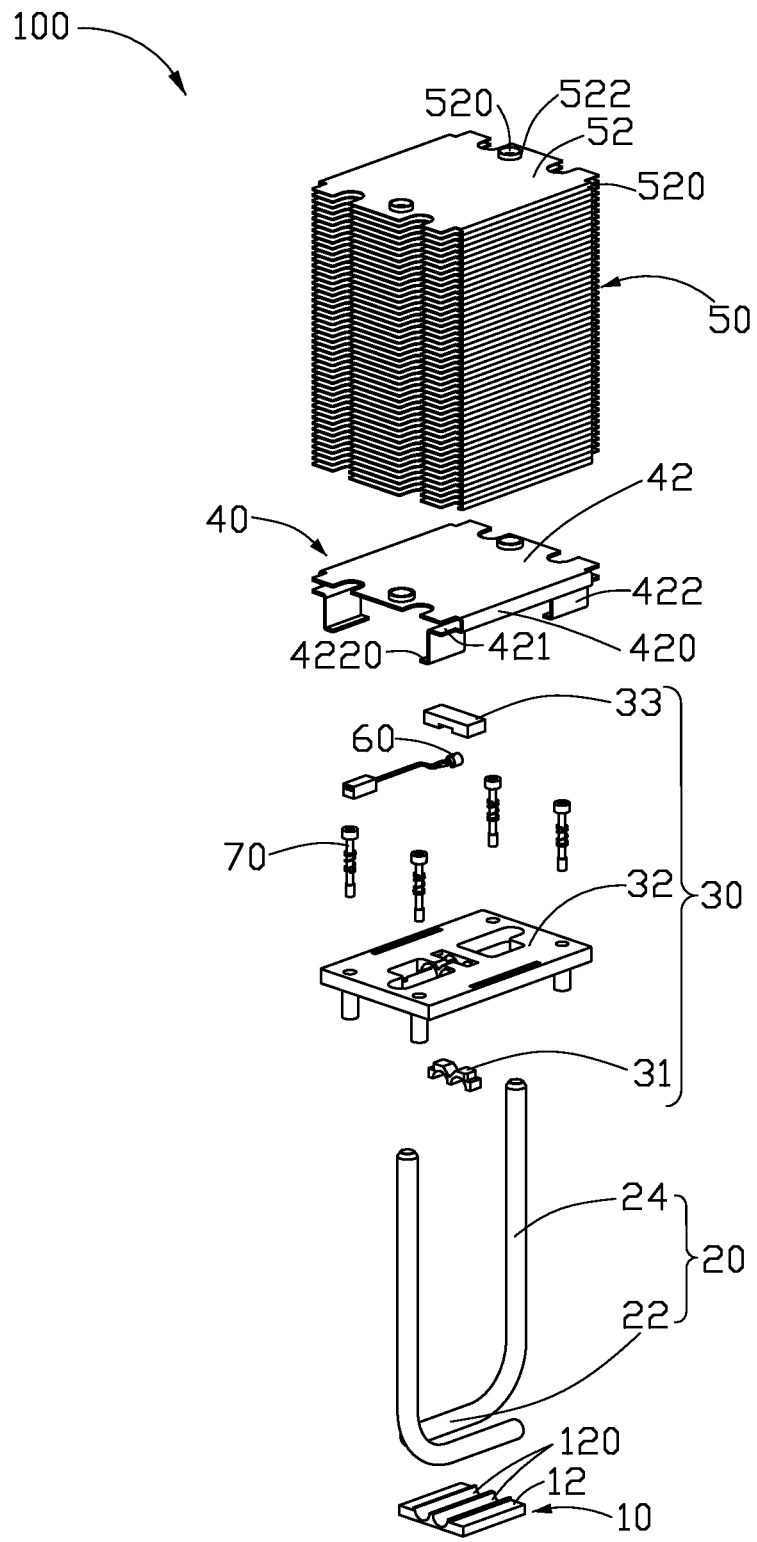
FIG. 2 is an exploded view of the heat sink assembly of FIG. 1.

FIGS. 1-2 show a heat sink assembly 100 in accordance with a first embodiment of the present disclosure. The heat sink assembly 100 is mounted on a printed circuit board (not shown), for dissipating heat generated by an electronic device (not shown) attached on the printed circuit board.

The heat sink assembly 100 comprises a heat spreader 10 adapted for contacting the electronic device, a pair of heat pipes 20, a seat 30, a supporting bracket 40 and a fin assembly 50. The heat pipes 20 thermally connect the heat spreader 10, the seat 30, the supporting bracket 40 and the fin assembly 50.

The heat spreader 10 has a bottom face (not labeled) for contacting the electronic device mounted on the printed circuit board to absorb heat therefrom, and a top face 12 with a pair of parallel grooves 120. The grooves 120 are adjacent to or adjoin each other.

Each heat pipe 20 comprises a horizontal evaporating portion 22 and a vertical condensing portion 24 arranged in such a manner that the heat pipe 20 has an L-shaped configuration. The condensing portion 24 extends perpendicularly from one of free ends of the evaporating portion 22. The evaporating portions 22 of the heat pipes 20 are soldered in the grooves 120 of the heat spreader 10. The condensing portions 24 are located at opposite lateral sides of the heat spreader 10, and extend through the seat 30, the supporting bracket 40 and the fin assembly 50.

Figure 3:
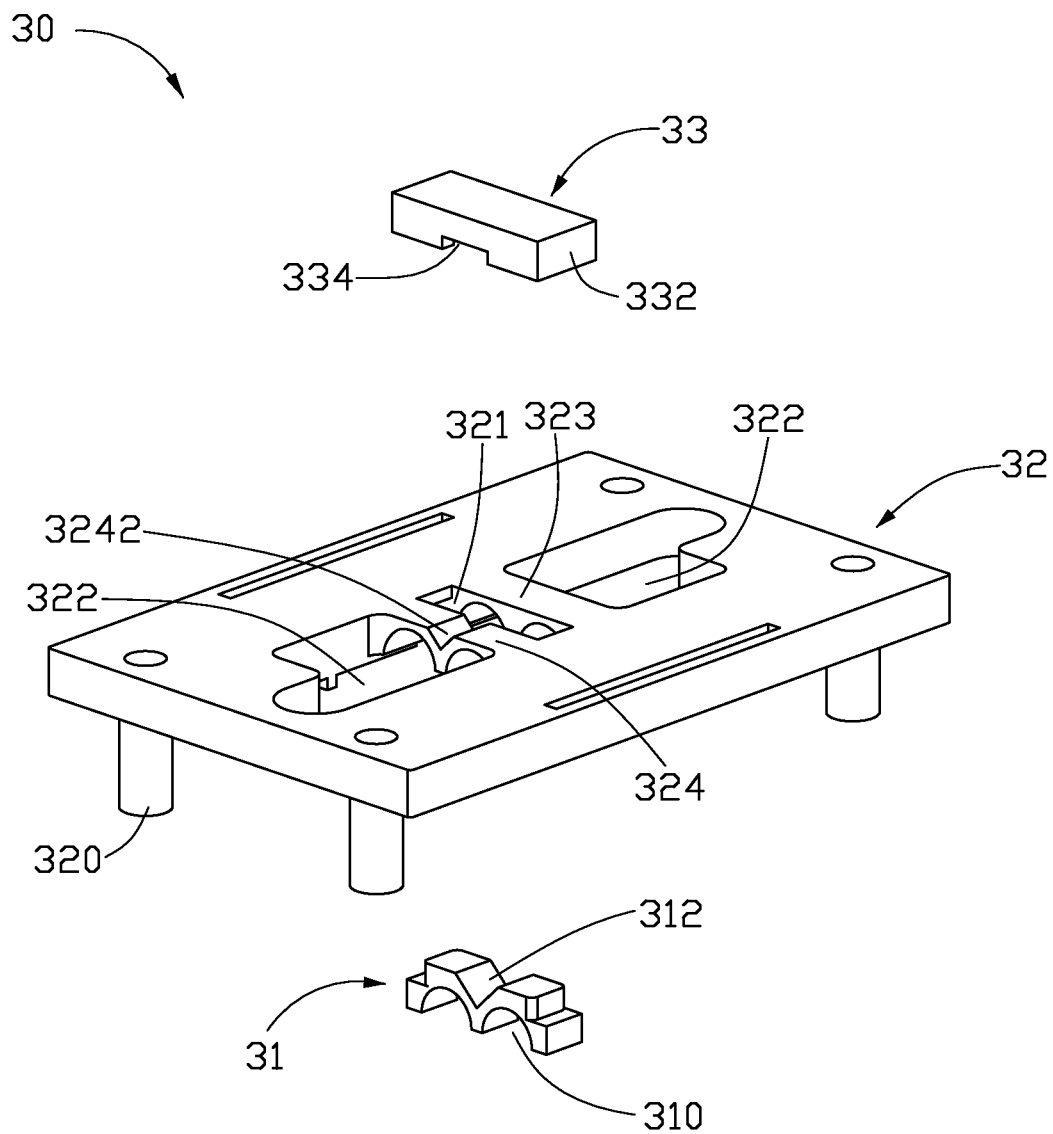
FIG. 3 is an enlarged, exploded isometric view of a seat of the heat sink assembly of FIG. 2.
Figure 4:
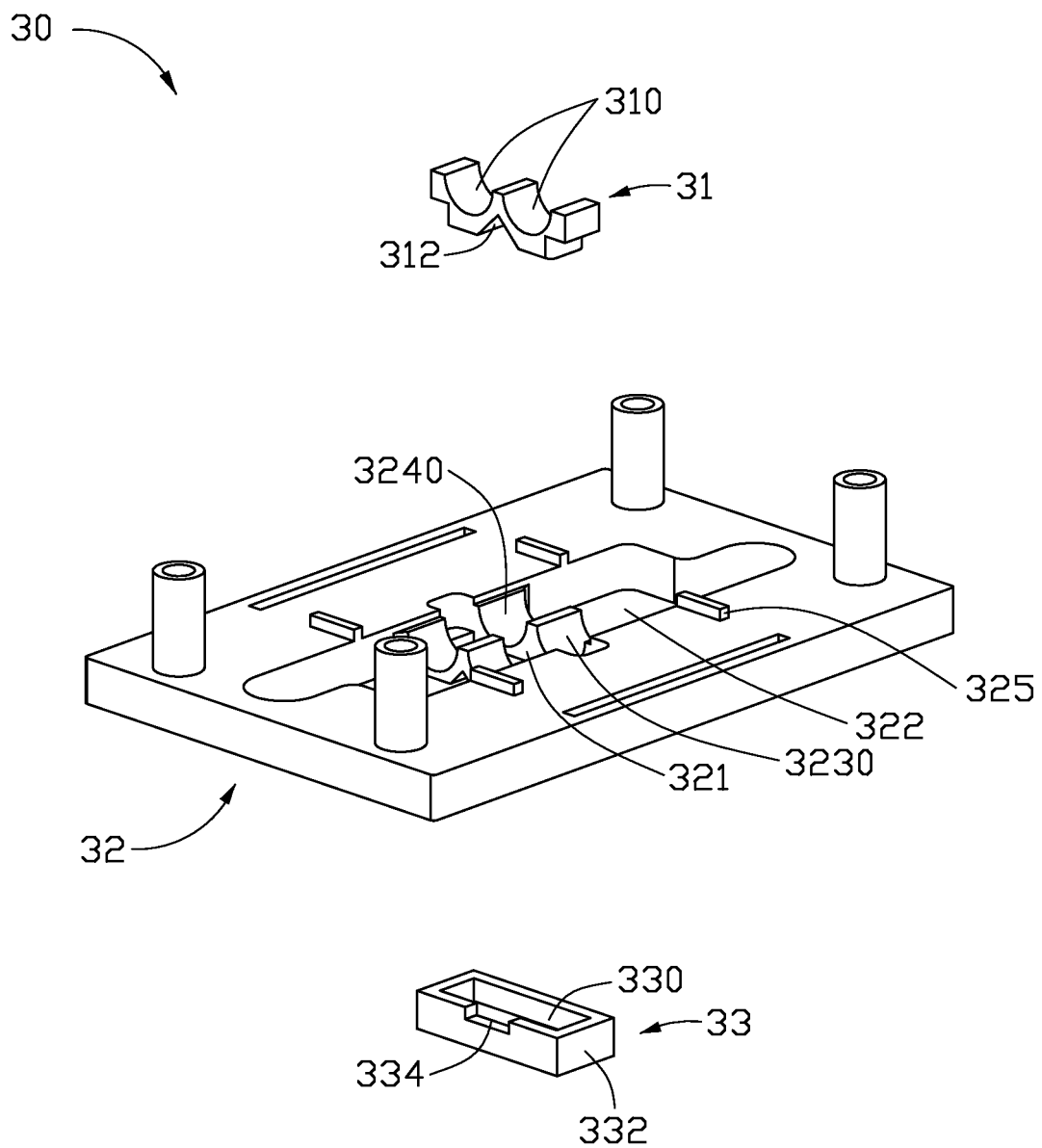
FIG. 4 is similar to FIG. 3, but showing the seat inverted.

Also referring to FIGS. 3-4, the seat 30 comprises a base plate 32, and a connecting element 31 and a protecting element 33 attached to the base plate 32. A temperature sensor 60 (shown in FIG. 2) is mounted between the connecting element 31 and the protecting element 33, for controlling a speed of a fan (not shown) mounted on the heat sink assembly 100. The base plate 32 has a rectangular configuration and is made of metallic material, such as aluminum. Four poles 320 extend downwardly from four corners of the base plate 32, for providing passage for corresponding fasteners 70 to mount the seat 30 on the printed circuit board. A rectangular through slot 321 is defined in a central portion of the base plate 32, for receiving the connecting element 31 therein. A pair of openings 322 are defined at both flanks of the slot 321 for receiving the evaporating portions 22 and curved portions (not labeled) of the heat pipes 20. Two beams 323, 324 are formed between the slot 321 and the openings 322. The beam 324 defines a V-shaped slot 3242 at a top thereof for providing passage for a signal wire of the sensor 60. Each of the beams 323, 324 defines a pair of adjoining semicircular grooves 3230, 3240 at a bottom thereof. The heat spreader 10 is mounted on a bottom of the two beams 323, 324. The semicircular grooves 120 of the heat spreader 10 are in vertical alignment with the semicircular grooves 3230, 3240 of the beams 323, 324. Four bars 325 are formed on the bottom of the base plate 32, for preventing movement of the heat spreader 10 relative to the base plate 32 of the seat 30.

The connecting element 31 is received in the slot 321 of the base plate 32. The connecting element 31 defines a pair of semicircular grooves 310 horizontally in alignment with the grooves 3230, 3240 of the base plate 32. These grooves 310, 3230, 3240 and the grooves 120 of the heat spreader 10 cooperatively define a pair of channels (not labeled) for receiving the evaporating portions 22 of the heat pipes 20 therein. The connecting element 31 defines a V-shaped slot 312 at a top portion thereof horizontally in alignment with the slot 3242 of the beam 324 of the base plate 32.

The protecting element 33 is mounted on the base plate 32 and engages with the connecting element 31. The protecting element 33 has a rectangular configuration and defines a rectangular receiving space 330, which is bounded by four sidewalls 332 of the protecting element 33. The receiving space 330 and the V-shaped slot 312 of the connecting element 31 cooperatively receiving the sensor 60 therein. A cutout 334 is defined at a bottom edge of one of the sidewalls 322 of the protecting element 33, for facilitating passage of the signal wire of the sensor 60.

Referring to FIG. 2 again, the fin assembly 50 comprises a number of fins each having a flat body 52 parallel to the base plate 32. The bodies 52 of the fins are perforated with through holes 520. Each of the through holes 520 has its respective annular sidewall 522 that is formed during punching. The condensing portions 24 of the heat pipes 20 are received in the through holes 520 and soldered to the sidewalls 522 so that the fin assembly 50 is combined with the condensing portions 24 of the heat pipes 20. The fin assembly 50 has a bottom fin functioning as the supporting bracket 40. The supporting bracket 40 supports the fin assembly 50 on the base plate 32 of the seat 30 and reinforces the whole strength of the fin assembly 50, in addition to its function of heat dissipation.

The supporting bracket 40 also has a body 42 with a configuration similar to that of each of the bodies 52 of the fins. A pair of opposite sidewalls 420 extend perpendicularly and downwardly from front and rear edges of the body 42. A pair of connecting walls 421 are bent inwards and horizontally from edges of the sidewalls 420. A pair of L-shaped supporting tabs 422 respectively extend downwardly and vertically from an edge of each connecting wall 421. The two pairs of supporting tabs 422 are located at opposite ends of the body 42. A flat engaging portion 4220 is formed horizontally and inwardly at a free end of each supporting tab 422, for engaging with a top surface of the base plate 32.

In assembly, the evaporating portions 22 of the heat pipes 20 are received in the bottom of the base plate 32 after the connecting element 31 is mounted on the base plate 32 of the seat 30. The heat spreader 10 is attached on the bottom of the base plate 32 and engages with the evaporating portions 22 of the heat pipes 20. The protecting element 33 covers the connecting element 31 after the sensor 60 is received in the connecting element 31. The supporting bracket 40 and the fin assembly 50 are mounted on the base plate 32 of the seat 30 in that order. The condensing portions 24 are extended through the supporting bracket 40 and the fin assembly 50 simultaneously. Thus, the heat sink assembly 100 is fully assembled.

Figure 5:
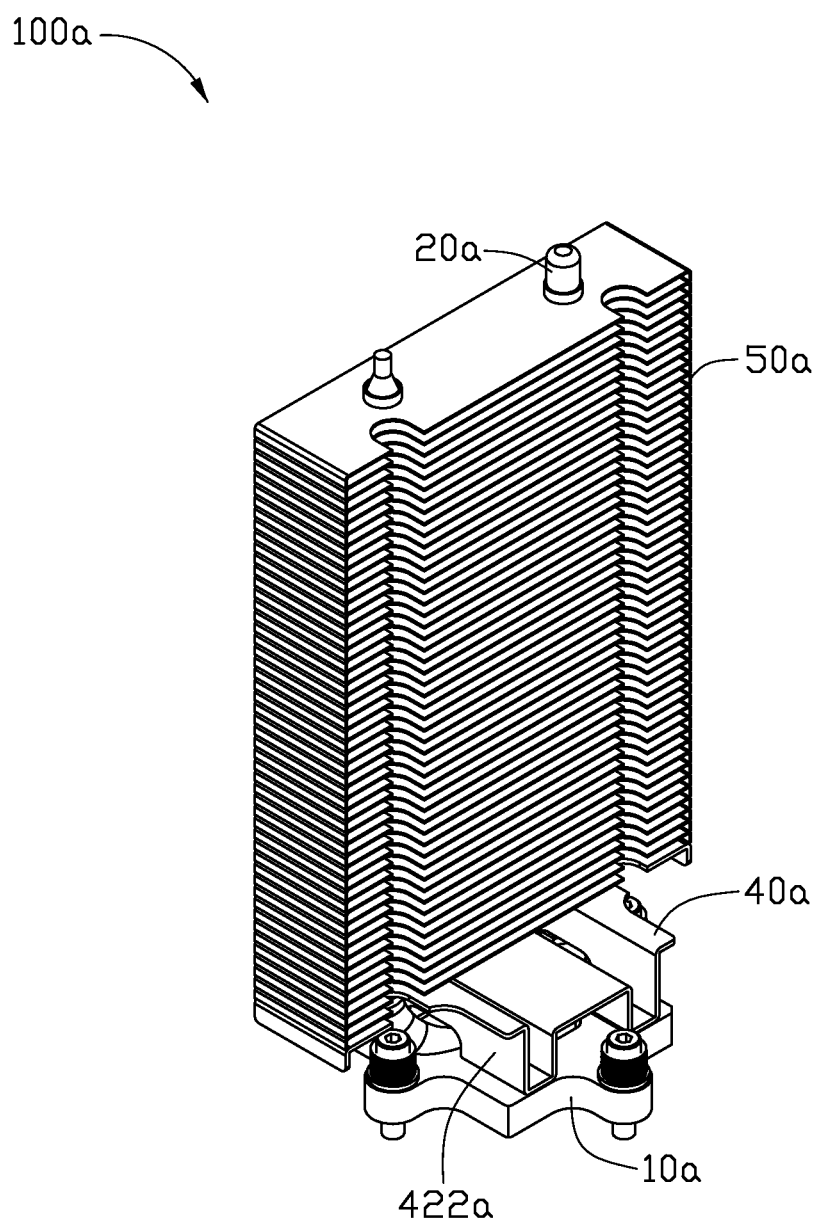
FIG. 5 is an assembled view of a heat sink assembly in accordance with a second embodiment of the present invention.
Figure 6:
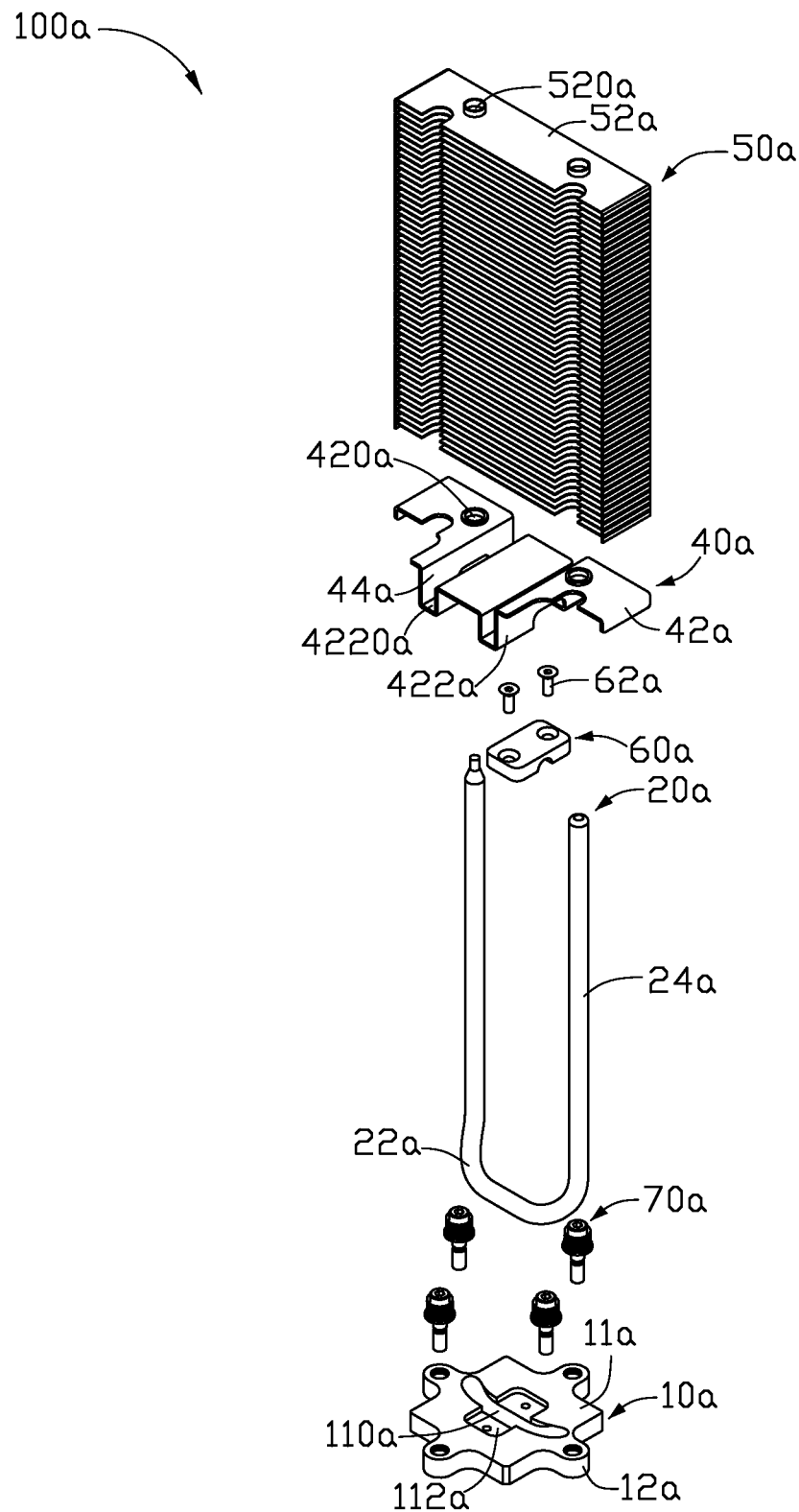
FIG. 6 is an exploded view of the heat sink assembly of FIG. 5.

Referring to FIGS. 5-6, a heat sink assembly 100a according to a second embodiment of the present invention is shown. The heat sink assembly 100a in the second embodiment comprises a base plate 10a, a heat pipe 20a, a fixing block 60a, a supporting bracket 40a and a fin assembly 50a. The heat pipe 20a thermally connects the base plate 10a, the fixing block 60a, the supporting bracket 40a and the fin assembly 50a.

The base plate 10a has a square body 11a. Four ears 12a extend horizontally from a center of each sidewall of the body 11a. Four corresponding fasteners 70a extend through the four ears 12a, for mounting the heat sink assembly 100a onto a printed circuit board (not shown). An arced slot 110a and a rectangular slot 112a are defined in the body 11a, and intersect each other. The slots 110a, 112a are both defined at a central portion of the body 11a. The slot 110a is deeper than the slot 112a.

The heat pipe 20a comprises an arced evaporating portion 22a, and a pair of vertical condensing portions 24a perpendicularly extending from two opposite ends of the evaporating portion 22a. The evaporating portion 22a of the heat pipe 20a is received in the slot 110a of the base plate 10a. The fixing block 60a is received in the slot 112a of the base plate 10a. A pair of rivets 62a extend through the fixing block 60a and engage in the base plate 10a, to mount the fixing block 60a onto the evaporating portion 22a of the heat pipe 20a.

The fin assembly 50a comprises a number of fins each having a flat body 52a parallel to the base plate 10a. Each flat body 52a is perforated with a pair of through holes 520a. The condensing portions 24a of the heat pipe 20a are soldered in the through holes 520a so that the fins are joined with the heat pipes 20a. The fin assembly 50a has a bottom fin functioning as the supporting bracket 40a to support the fin assembly 50 on the base plate 10a and reinforce the strength of the fin assembly 50a.

The supporting bracket 40a has a portion corresponding to and vertically in alignment with each body 52a of the fin assembly 50a, and another portion extending beyond the body 52a. The supporting bracket 40a has a top surface 42a parallel to each body 52a of the fin assembly 50a. A pair of spaced through holes 420a are defined at the top surface 42a of the supporting bracket 40a and vertically in alignment with the through holes 520 of the fin assembly 50a. The top surface 42a of the supporting bracket 40a is stamped downwardly to form a pair of U-shaped supporting tabs 422a located below the top surface 42a. The supporting tabs 422a traverse between the two condensing portions 24a of the heat pipes 20a. Each of the supporting tabs 422a defines a corresponding U-shaped recess 44a. Each supporting tab 422a comprises a flat engaging portion 4220a engaging with a top surface of the base plate 10a.

In the present embodiments, by the provision of the supporting brackets 40, 40a formed by the bottom fin of the fin assembly 50, 50a, the fin assembly 50, 50a can be firmly mounted to the base plate 30, 10a. Thus, strength of the heat sink assembly is increased.

It is to be understood, however, that even though numerous characteristics and advantages of the present embodiments have been set forth in the foregoing description, together with details of the configurations and functions of the embodiments, the disclosure is illustrative only, and changes may be made in detail, especially in matters of shape, size, and arrangement of parts within the principles of the embodiments to the full extent indicated by the broad general meaning of the terms in which the appended claims are expressed.

The invention claimed is:

1. A heat sink assembly comprising:
a base plate;
a plurality of parallel fins mounted on and thermally connecting with the base plate for dissipating heat from the base plate, said fins comprising a bottom fin having a body parallel to the base plate and a plurality of supporting tabs extending downwardly from the body, the supporting tabs engaging with a top surface of the base plate to support the fins on the base plate and reinforce a whole strength of the heat sink assembly;
a heat spreader mounted below the base plate; and
a heat pipe comprising a horizontal evaporating portion sandwiched between the heat spreader and the base plate and a vertical condensing portion extending from a free end of the evaporation portion and passing through the fins, and wherein a connecting element and a protecting element are attached on the base plate and cooperatively receive a temperature sensor and wherein a rectangular through slot is defined in a central portion of the base plate for receiving the connecting element therein, and the protecting element engages with the connecting element.

2. The heat sink assembly of claim 1, wherein the supporting tabs respectively extend from two opposite sides of the bottom fin, and each of the supporting tabs comprises an engaging portion engaging with the top surface of the base plate.

3. The heat sink assembly of claim 2, wherein each of the supporting tabs has an L-shaped configuration.

4. The heat sink assembly of claim 3, wherein a pair of opposite sidewalls extend perpendicularly and downwardly from the two opposite sides of the body of the bottom fin, a pair of connecting walls are bent inwards and horizontally from edges of the sidewalls, and the supporting tabs respectively extend from edges of the connecting walls.

5. The heat sink assembly of claim 1, wherein a pair of openings are defined at both flanks of the through slot of the base plate for receiving the evaporating portion of the heat pipe.

6. The heat sink assembly of claim 5, wherein two beams are formed between the through slot and the openings, each of the two beams defines a semicircular groove communicating with the through slot and the corresponding opening, and the evaporating portion of the heat pipe is horizontally received in a combination of the openings, the through slot and the two grooves of the two beams.

7. A heat sink assembly comprising:
a base plate defining an opening;
a plurality of fins mounted on and thermally connecting with the base plate, each of the fins parallel to a top surface of the base plate;
a supporting bracket mounted between the base plate and the fins for supporting the fins on the base plate, the supporting bracket comprising a flat body and a plurality of supporting tabs engaging with the top surface of the base plate, the supporting tabs separating the body of the supporting bracket and the base plate; and
a heat pipe comprising an evaporating portion received in the opening of the base plate and a condensing portion extending from a free end of the evaporating portion and extending through the supporting bracket and the fins, and wherein a connecting element and a protecting element are attached on the base plate and cooperatively receive a temperature sensor and wherein a rectangular through slot is defined in a central portion of the base plate for receiving the connecting element therein, and the protecting element engages with the connecting element.

8. The heat sink assembly of claim 5, wherein the supporting tabs extend from opposite sides of the body of the supporting bracket.

9. The heat sink assembly of claim 6, wherein each of the supporting tabs has an L-shaped configuration.

10. The heat sink assembly of claim 7, wherein a pair of opposite sidewalls extend perpendicularly and downwardly from the two opposite sides of the body of the supporting bracket, a pair of connecting walls are bent inwards and horizontally from edges of the sidewalls, and the supporting tabs respectively extend from edges of the connecting walls.

11. The heat sink assembly of claim 5, wherein the base plate further defines another opening, the two openings of the base plate are defined at both flanks of the through slot of the base plate, and the evaporating portion of the heat pipe is received in the openings.

12. The heat sink assembly of claim 9, wherein two beams are formed between the through slot and the openings, each of the two beams defines a semicircular groove communicating with the through slot and the corresponding opening, and the evaporating portion of the heat pipe is horizontally received in a combination of the openings, the through slot and the two semicircular grooves of the two beams.

13. The heat sink assembly of claim 10, further comprising a heat spreader defining a semicircular groove, wherein the semicircular groove of the heat spreader and the combination of the openings, the through slot and the two semicircular grooves of the two beams cooperatively define a channel receiving the evaporating portion of the heat pipe.

14. A heat sink assembly comprising:
a base plate defining a pair of openings;
a heat spreader mounted below the base plate;
a plurality of fins parallel to the base plate and located above the base plate, wherein
a bottom one of the fins comprises two tabs extending downwardly from opposite sides thereof to engage with the base plate, thereby reinforcing connection strength between the fins and the base plate; and
a pair of heat pipes each having an L-shaped configuration, each heat pipe comprising a horizontal evaporating portion received in the openings of the base plate and thermally engaging with the heat spreader, and a condensing portion extending from a free end of the evaporation portion and extending through the fins and thermally connecting therewith, whereby heat of the heat spreader is transferred to the fins via the heat pipes, and wherein each of the tabs has an L-shaped configuration, and wherein a pair of opposite sidewalls extend perpendicularly and downwardly from the two opposite sides of the bottom one of the fins, a pair of connecting walls are bent inwards and horizontally from edges of the sidewalls, and the supporting tabs respectively extend from edges of the connecting walls.

\* \* \* \* \*